US010914787B2

United States Patent
Ye et al.

(10) Patent No.: US 10,914,787 B2
(45) Date of Patent: Feb. 9, 2021

(54) METHOD AND APPARATUS FOR PROCESSING DATA OF MULTIFUNCTIONAL AUTOMOBILE CHARGER BY USING MICROPROCESSOR

(71) Applicant: Dongguan Zhongkang Technology Electronics Co., LTD, Dongguan (CN)

(72) Inventors: Jianxin Ye, Dongguan (CN); Yuping Luo, Fengcheng (CN); Shihao Huang, Jiujiang (CN)

(*) Notice: Subject to any disclaimer, the term of this patent is extended or adjusted under 35 U.S.C. 154(b) by 222 days.

(21) Appl. No.: 16/105,245

(22) Filed: Aug. 20, 2018

(65) Prior Publication Data

US 2019/0235026 A1 Aug. 1, 2019

(30) Foreign Application Priority Data

Jan. 29, 2018 (CN) .......................... 2018 1 0085972

(51) Int. Cl.
*G01R 31/382* (2019.01)
*H01M 10/48* (2006.01)
*H02J 50/12* (2016.01)
*H02J 7/00* (2006.01)
*B60K 35/00* (2006.01)
*H01M 10/44* (2006.01)

(52) U.S. Cl.
CPC ............ *G01R 31/382* (2019.01); *B60K 35/00* (2013.01); *H01M 10/44* (2013.01); *H01M 10/486* (2013.01); *H02J 7/0047* (2013.01); *H02J 50/12* (2016.02); *B60K 2370/42* (2019.05); *B60K 2370/46* (2019.05); *H01M 2220/20* (2013.01)

(58) Field of Classification Search
CPC .................................................... G01R 31/382
See application file for complete search history.

(56) References Cited

U.S. PATENT DOCUMENTS

| 2009/0108825 | A1* | 4/2009 | Yang | ......................... H02J 7/06 323/288 |
| 2012/0105001 | A1* | 5/2012 | Gallegos | ............... B60L 3/0092 320/109 |
| 2015/0270727 | A1* | 9/2015 | Fukute | ................ H01M 10/482 320/107 |
| 2019/0212974 | A1* | 7/2019 | Shi | ......................... H04W 4/40 |

* cited by examiner

*Primary Examiner* — Hyun D Park
(74) *Attorney, Agent, or Firm* — HYIP

(57) ABSTRACT

The present invention discloses a method and an apparatus for processing data of a multifunctional automobile charger by using a microprocessor. A main program module, an ignition current detection module, a charging current detection module, an internal battery constant current charging detection module, an internal battery temperature detection module, an output current detection module, a wireless charging failure detection module, a module for Bluetooth communication with a mobile phone and so on are loaded in a single chip microcomputer. Instructions of the modules are executed by a processor. The present invention provides an ignition function for an automobile, can communicate with a mobile phone, and is convenient to use.

10 Claims, 7 Drawing Sheets

11 Power-on circuit unit

91 Bluetooth circuit unit

61 Battery temperature detection circuit unit

31 Ignition current detection circuit unit

METHOD AND APPARATUS FOR PROCESSING DATA OF MULTIFUNCTIONAL AUTOMOBILE CHARGER BY USING MICROPROCESSOR

TECHNICAL FIELD

The present invention relates to charger technologies, and in particular, to a method and device for processing data of a multifunctional automobile charger by using a microprocessor in a portable charger.

BACKGROUND ART

In the prior art, ordinary chargers all have few functions. Such chargers either can only charge smart phones, portable music players (such as iPod or MP3 players), tablet computers, notebooks, portable game consoles, and so on, or are fixed chargers for charging large devices. Moreover, it is difficult for one charger to charge multiple devices at the same time.

When a charger is to charge an automobile storage battery, a port of the automobile charger can only be connected to a dedicated cable, and such an adapter is often bulky.

Moreover, ordinary charging devices are generally designed for specific devices, such as smartphones of specific brands, types or models, and cannot be used for other devices.

Similarly, portable power chargers often can only charge handheld electronic devices with a direct current, but cannot charge automobile storage batteries.

The chargers in the prior art also have the following defect: an ordinary charger can charge one device first, and then charge another device after the charging of the first device is finished. Often, such a charger does not have enough remaining power to fully charge the second device.

In addition, it is not allowed to use chargers to charge electric devices while the chargers themselves are being charged or connected to an alternating current power supply. Such chargers should be disconnected from the power supply first, so as to transfer power to the devices connected to the chargers. At the same time, some of these charging devices need to be fully charged before charging the devices connected to them.

Furthermore, at present, batteries of portable chargers on the market have a limited capacity, and only few portable chargers can charge notebooks. There are even fewer chargers that can charge ignite automobiles, and the chargers providing such a function on the market are too big to carry.

In view of the above, in life, people are looking forward to a multifunctional and portable charger to charge multiple devices including automobile storage batteries, notebooks, a variety of handheld portable electronic devices, smart phones, mobile phones, data tablets, music players, cameras, video cameras, game consoles, e-books, Bluetooth® headphones as well as ordinary headphones, GPS devices, and so on. The charger can charge one or more devices at the same time, whether you are at home or in the office or whether you are in a car or an airplane.

Many new designs have been made to meet people's needs. For example, Chinese utility model patent with Application No. 200720000487.9, entitled "Automobile Charger" and filed by Shenzhen Huawei Communications Technology Co. Ltd. employs the following technical solution: "An automobile charger includes an input circuit, a charging circuit and an output circuit, where power is inputted via the input circuit, processed by the charging circuit and then outputted by the output circuit; a voltage comparison unit is further included between the input circuit and the charging circuit, for detecting a voltage of the power inputted via the input circuit to judge whether the voltage is in line with a preset standard."

It can be seen from the analysis on the patent document that the technical solution of the patent is only a simple block diagram and does not provide a specific implementation circuit and a product structure.

Besides, an invention patent with Application No. 201510070721.4, entitled "Smart Electric Automobile Charger" and filed by Ningbo Hi-Tech Zone 007 Industrial Design Co. Ltd. employs the following technical solution: "A smart electric automobile charger includes a single chip computer, a drive circuit and a capacitor buck converter, where a direct current is input to a storage battery for charging. The present invention uses a high-power quick charger which is based on the capacitor buck converter and the single chip computer and has a charging current of 30 A; the charger can fully charge an electric automobile storage battery in a short period of time and can meet the need of using an electric automobile."

It can be seen from analysis that the technical solution of the patent is a charging mode using an alternating current power supply, and is not a desired portable mode.

Therefore, it is necessary to design a charger that can ignite an automobile, wherein the charger can also communicate with a mobile phone and send various parameters of the charger to the mobile phone, so that a user can clearly understand the state of the charger over the mobile phone and clearly know what the charger can do now. The charger should further have a TYPE-C socket and be suitable for a wide variety of electric devices. The charger should further have a wireless charging output function and should be used by people conveniently. Such a charger is lacking in the prior art.

SUMMARY OF THE INVENTION

An objective of the present invention is to design and manufacture a method and an apparatus for processing data of a multifunctional automobile charger by using a microprocessor to solve the shortcoming in the prior art that "there is a lack of a charger that can ignite an automobile and can communicate with a mobile phone and send various parameters of the charger to the mobile phone so that a user can clearly understand the state of the charger over the mobile phone and clearly know what the charger can do now; such a charger should further have a TYPE-C socket and be suitable for a wide variety of electric devices, and should further have a wireless charging output function and should be used by people conveniently."

The present invention is implemented by using the following technical solutions.

A method for processing data of a multifunctional automobile charger by using a microprocessor is implemented, and the method includes the following steps:

step 1: first disposing a single chip microcomputer on a main circuit board in a charger box, wherein a program memory is disposed in the single chip microcomputer; a main program module, an ignition current detection program module, a TYPE-C charging current detection program module, an internal battery constant current charging detection program module, an internal battery temperature detection program module, a general U-port output current detection program module, a wireless charging failure detection program module, and a program module for Bluetooth communication with a mobile phone are loaded in the single chip microcomputer; and instructions of the program modules are suitable for being loaded and executed by a processor;

step 2: after the charger box is controlled to start up, the main program module calling a constant current charging adjustment circuit unit to detect a voltage B+ of an internal battery; the internal battery constant current charging detection program module performing A/D conversion on analog data of the voltage B+ of the internal battery to obtain digital data and storing the digital data into a program running variable register, and then comparing the data with a voltage form in the internal battery constant current charging detection program module to obtain present voltage data of the voltage B+ of the internal battery; and the main program module determining, according to the voltage data, lamps to be turned on in indicator lamps 1 to 4;

step 3: next, determining data processing of subsequent operations: a. if the internal battery is charged, proceeding to data processing in step 4; b. if power is taken from a TYPE-C port, proceeding to data processing in step 5; c. if power is taken from a general U port, proceeding to data processing in step 6; d. if wireless charging is performed, proceeding to data processing in step 7; e. if Bluetooth communication is conducted with a mobile phone, proceeding to data processing in step 8; and f. if the internal battery is used for ignition, proceeding to data processing in step 9;

step 4: when the internal battery is charged, the internal battery constant current charging detection program module detecting an analog voltage value inputted via an $18^{th}$ pin E of the single chip microcomputer, calling an A/D conversion subprogram module to process the analog voltage value, storing the voltage value into the program running variable register, then looking up a table to convert the voltage value into a present charging current value, and comparing the present charging current value with a target charging current value stored in the internal battery constant current charging detection program module; if the present charging current value is not consistent with the target charging current value, adjusting a pulse width of a PWM signal outputted by a $2^{nd}$ pin of the single chip microcomputer; then re-detecting the present charging current value and re-comparing the present charging current value with the target charging current value; and if the present charging current value is consistent with the target charging current value, charging the internal battery continuously, and proceeding to step 10;

step 5: when power is taken from the TYPE-C port, the TYPE-C charging current detection program module calling an extended port A/D subprogram module, and selecting analog voltage data on a TYPE-C-AD2 line in a TYPE-C circuit unit, and inputting the analog voltage data via a $21^{st}$ pin AD-OUT of the single chip microcomputer; after calling the A/D conversion subprogram module to process the analog voltage data, the TYPE-C charging current detection program module storing the voltage value into the program running variable register, and then looking up a table to convert the voltage value into a present charging current value; at this point, if the TYPE-C charging current detection program module judges that an output current at the TYPE-C port is greater than or equal to 0.2 A, continuing charging the internal battery, and if the TYPE-C charging current detection program module judges that the output current is less than 0.2 A, calling a delay subprogram module to turn off the output of the TYPE-C port 30 minutes later; and then proceeding to step 10;

step 6: when power is taken from the general U port, the main program module inspecting on-off data inputted via a $34^{th}$ pin of the single chip microcomputer of a single action button unit; then the general U-port output current detection program module being executed, calling the extended port A/D subprogram module, selecting analog voltage data on an ADI line of a general U-port 5V output circuit unit, and inputting the analog voltage data via a $14^{th}$ pin of the single chip microcomputer; after calling the A/D conversion subprogram module to process the analog voltage data, the general U-port output current detection program module storing the voltage value into the program running variable register, and then looking up a table to convert the voltage value into a present charging current value; at this point, if the general U-port output current detection program module judges that an output current at a first general U port or a second general U port is greater than or equal to 0.2 A, continuing charging the internal battery, and if the general U-port output current detection program module judges that the output current is less than 0.2 A, calling the delay subprogram module to turn off the output of the general U port 30 minutes later; and then proceeding to step 10;

step 7: when wireless charging is performed, the wireless charging failure detection program module calling a wireless charging subprogram module to detect on-off quantity data inputted via a $1^{st}$ pin AD2 of the single chip microcomputer; if the input is "0", keeping a $40^{th}$ pin of the single chip microcomputer as "1" all the time, and when the input of the $1^{st}$ pin of the single chip microcomputer is "1", the wireless charging failure detection program module driving the $40^{th}$ pin of the single chip microcomputer to be "0", turning off the power supply for a wireless charging failure detection circuit unit, and proceeding to step 10;

step 8: when Bluetooth communication is conducted with the mobile phone, the program module for Bluetooth communication with a mobile phone starting to run to cause the single chip microcomputer to conduct serial asynchronous communication with a Bluetooth chip IC13 in a Bluetooth circuit unit, and sending present remaining capacity data, battery voltage data, battery temperature data, working state data of button switches, alarm status data, and ignition frequency data to the mobile phone via the Bluetooth circuit unit, corresponding APP software in the mobile phone displaying the data on a user interface of the mobile phone, and proceeding to step 10;

step 9: when the internal battery is used for ignition, first pressing down an ignite button, and the ignition current detection program module starting to run, an ignition current detection circuit unit being connected to a $17^{th}$ pin V4 of the single chip microcomputer to input analog voltage data that is obtained after a voltage drop of a current between battery cathode lines B1− and B2− on a line resistor is amplified; after calling the A/D conversion subprogram module to process the analog voltage data, the ignition current detection program module storing the data into the program running variable register, and comparing the data with a value that has been set in the ignition current detection program module; if the ignition circuit data is less than the set data, the ignition current detection program module outputting "0" to a $23^{rd}$ pin REPLAY of the single chip microcomputer to turn off the ignition current detection circuit unit, and proceeding to step 10; and step 10: in the meanwhile, the internal battery temperature detection program module constantly inputting analog voltage data via a $13^{rd}$ pin NTC of the single chip microcomputer, first calling the A/D conversion subprogram module to process the analog voltage data, storing the data into the program running variable register, then calling a battery temperature conversion subprogram module to process the data, comparing the data with a temperature comparison form set in the internal battery temperature detection program module to determine a present battery temperature; when the battery temperature is higher than 60° C., immediately alarming for 5 seconds, and turning off all output operations; if the battery temperature is normal, proceeding to step 3; and if there are no other operations and no ongoing process, the main program module turning off the power 5 minutes later.

In step 4, after the A/D conversion subprogram module is called to process the analog voltage value inputted via the $18^{th}$ pin E of the single chip microcomputer, the voltage value is stored into the program running variable register, then the table is looked up to convert the voltage value into a present charging current value, and the present charging current value is compared with the target charging current value stored in the internal battery constant current charging detection program module; in the comparison, when the present charging current value is greater than the target charging current value, the internal battery constant current charging detection program module subtracts the target charging current value from the present charging current value to obtain a difference and reduces an output duty cycle of PWM according to the difference; otherwise, the internal battery constant current charging detection program module increases the duty cycle.

In step 5, when power is taken from the TYPE-C port, the TYPE-C charging current detection program module calls the extended port A/D subprogram module and selects the analog voltage data on the TYPE-C-AD2 line in the TYPE-C circuit unit, wherein the analog voltage data is selected in the following manner: the extended port A/D subprogram module sets an $11^{th}$ pin A01 of the single chip microcomputer to "1", sets an $8^{th}$ pin B01 to "0", and sets a $7^{th}$ pin C01 to "0".

In step 6, after the work begins, the main program module inspects the on-off data inputted via the $34^{th}$ pin of the single chip microcomputer of the single action button unit and then the general U-port output current detection program module is executed, wherein step 6 is implemented in the following manner: the main program module (111) outputs on-off quantity data "1" to a $40^{th}$ pin USB1 of the single chip microcomputer when detecting that on-off quantity data of the $34^{th}$ pin of the single chip microcomputer is "0".

In step 7, the wireless charging failure detection program module calls the wireless charging subprogram module to detect the on-off quantity data inputted via the $1^{st}$ pin AD2 of the single chip microcomputer; if the input is "0", the wireless charging failure detection program module keeps the $40^{th}$ pin of the single chip microcomputer as "1" all the time, keeps the power supply, and at the same time, calls an LED lamp flow display subprogram module to drive LED lamps disposed on the top surface of the charger box to be turned on in a flowing manner.

When the program module for Bluetooth communication with a mobile phone starts to run, the Bluetooth chip IC13 needs to be successfully paired with Bluetooth of the mobile phone in advance; the remaining capacity data, the battery voltage data, the battery temperature data, the working state data of the button switches, the alarm status data, and the ignition frequency data are all stored in the program running variable register and wait for being called by the program module for Bluetooth communication with a mobile phone, and updated data will be sent to the mobile phone in real time.

In step 9, after the ignition current detection program module starts to run, a reverse battery connection subprogram module stored in the program memory is further called to detect whether an ignition clamp falls off, whether the ignition clamp is connected reversely, whether an ignition voltage exceeds a limit, and whether a backlash circuit exceeds a limit and is in a fault state, and if any of the above working states exists, the ignition current detection program module outputs on-off quantity data "0" via the $23^{rd}$ pin of the single chip microcomputer to turn off the output of the ignition current detection circuit unit.

An apparatus for processing data of a multifunctional automobile charger by using a microprocessor is designed and manufactured according to the above method, wherein the apparatus includes:

a charger box, wherein a single chip microcomputer is disposed on a main circuit board in the charger box; a program memory is disposed in the single chip microcomputer; a main program module, an ignition current detection program module, a TYPE-C charging current detection program module, an internal battery constant current charging detection program module, an internal battery temperature detection program module, a general U-port output current detection program module, a wireless charging failure detection program module, and a program module for Bluetooth communication with a mobile phone are loaded in the single chip microcomputer; and instructions of the program modules are suitable for being loaded and executed by a processor;

wherein the main program module inspects an ignite button, a 5V output button, a light button and an AC output button in a single operation button unit of the single chip microcomputer, and starts corresponding program modules to run according to input on-off quantity data "0" and "1"; after the main program module detects that a $34^{th}$ pin of the single chip microcomputer inputs "0" level data, the ignition current detection program module starts up, and the ignition current detection program module outputs "1" level data via a $23^{rd}$ pin of the single chip microcomputer and turns on the output of an ignition current detection circuit unit;

after starting to run, the TYPE-C charging current detection program module outputs "1" level data at a $40^{th}$ pin of the single chip microcomputer to switch on a TYPE-C charging current detection circuit unit to output power, and the TYPE-C charging current detection program module inputs detection data of a charging current via a $21^{st}$ pin of the single chip microcomputer and determines the time for turning off the output;

after starting to run, the internal battery constant current charging detection program module detects analog voltage data of an $18^{th}$ pin E of the single chip microcomputer to perform A/D conversion, obtains digital data, and converts the digital data into present charging current data, and stores the present charging current data into a program running variable register; when the present charging current value is greater than a target charging current value, the internal battery constant current charging detection program module (511) subtracts the target charging current value from the present charging current value to obtain a difference and reduces an output duty cycle of PWM according to the difference; otherwise, the internal battery constant current charging detection program module increases the duty cycle to implement constant current charging;

the internal battery temperature detection program module constantly inputs analog voltage data of temperatures via a $13^{rd}$ pin NTC of the single chip microcomputer; after calling an A/D conversion subprogram module to process the analog voltage data, the internal battery temperature detection program module stores the data into the program running variable register, then calls a battery temperature conversion subprogram module to process the data, compares the data with a temperature comparison form set in the internal battery temperature detection program module to determine a present battery temperature, and when the battery temperature is higher than 60° C., immediately alarms for 5 seconds, and turns off all output operations; if the battery temperature is normal, no processing is performed;

after being executed, the general U-port output current detection program module calls an extended port A/D subprogram module, selects analog voltage data on an ADI line of a general U-port 5V output circuit unit, and inputs the analog voltage data via a $14^{th}$ pin of the single chip microcomputer; after calling the A/D conversion subprogram module to process the analog voltage data, the general U-port output current detection program module stores the voltage value into the program running variable register, and then looks up a table to convert the voltage value into a present charging current value; at this point, if the general U-port output current detection program module judges that an output current at a first general U port or a second general U port is greater than or equal to 0.2 A, charging is continued, and if the general U-port output current detection program module judges that the output current is less than 0.2 A, the general U-port output current detection program module calls a delay subprogram module to turn off the output of the general U port 30 minutes later;

the wireless charging failure detection program module calls a wireless charging subprogram module to detect on-off quantity data inputted via a $1^{st}$ pin AD2 of the single chip microcomputer, and if the input is "0", keeps a $40^{th}$ pin of the single chip microcomputer as "1" all the time; when the input of the $1^{st}$ pin of the single chip microcomputer is "1", the wireless charging failure detection program module drives the $40^{th}$ pin of the single chip microcomputer to be "0", and turns off the power supply for a wireless charging failure detection circuit unit; and when the program module for Bluetooth communication with a mobile phone starts to run, the single chip microcomputer conducts serial asynchronous communication with a Bluetooth chip IC13 in a Bluetooth circuit unit, and sends present remaining capacity data, battery voltage data, battery temperature data, working state data of button switches, alarm status data, and ignition frequency data to a mobile phone via the Bluetooth circuit unit, and corresponding APP software in the mobile phone displays the data on a user interface of the mobile phone.

Subprogram modules stored in the program memory include the extended port A/D subprogram module, the A/D conversion subprogram module, the delay subprogram module, the battery temperature conversion subprogram module, the wireless charging subprogram module, an LED lamp flow display subprogram module, and a reverse battery connection subprogram module, and the subprogram modules can be called and executed by the program modules and the subprogram modules.

The charger box is a flat circular box body, an LED indicator lamp set is disposed on the top surface of the box body, and the LED indicator lamp set includes indicator lamps 1 to 4; a charging socket, an ignite button, an ignition output jack, the first general U port, the second general U port, a general U-port output button and a TYPE-C socket are sequentially arranged on the front surface of the charger box; a Bluetooth circuit board is disposed at a box arc edge of the charger box on one side of the TYPE-C socket, and an antenna charging coil is disposed on the top surface of the box body.

The beneficial effects of the present invention are as follows: the patent provides a charger which can ignite an automobile, and can communicate with mobile phones and send various parameters of the charger to the mobile phones, so that a user can clearly understand the state of the charger over the mobile phone and clearly know what the charger can do now; the charger further has a TYPE-C socket and is suitable for a wide variety of electric devices; and the charger further has a wireless charging output function and can be used by people conveniently.

BRIEF DESCRIPTION OF THE DRAWINGS

The present invention is further described below with reference to the accompanying drawings, but embodiments in the accompanying drawings do not constitute any limitation to the present invention.

DETAILED DESCRIPTION

The present invention is described in the following in combination with a specific first implementation manner.

Figure 1:
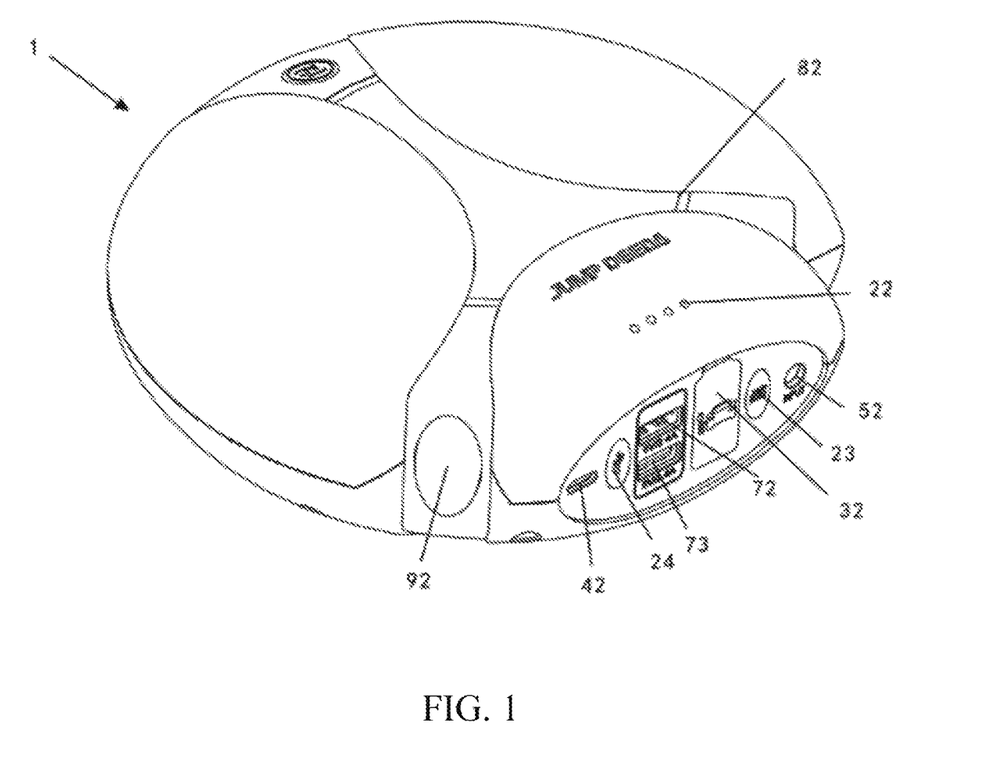
FIG. 1 is an overall schematic diagram of a method and an apparatus for processing data of a multifunctional automobile charger by using a microprocessor according to the present invention, in which a charger box 1 is a portable structure.
Figure 7:
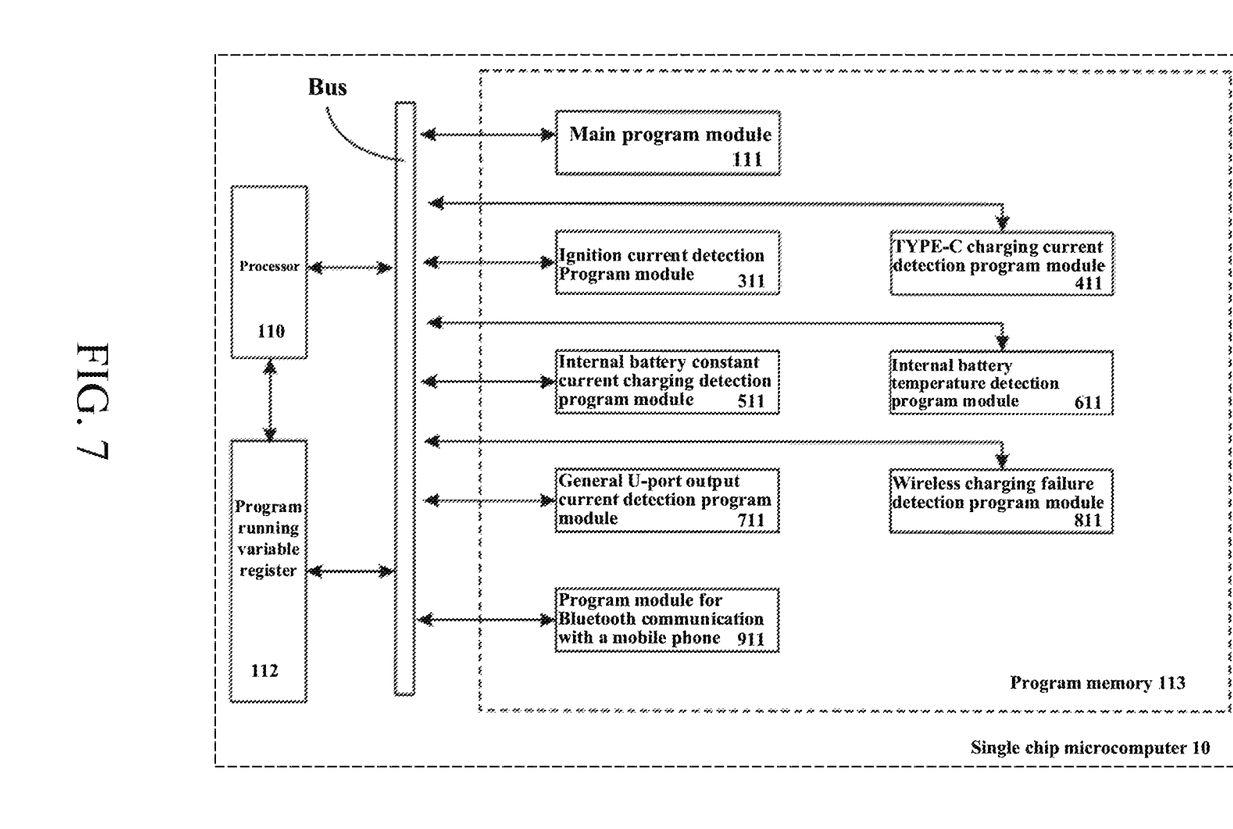
FIG. 7 is a schematic diagram of setting of program modules in a program memory 113 in a single chip microcomputer 10 in a method and an apparatus for processing data of a multifunctional automobile charger by using a microprocessor according to the present invention.

As shown in FIG. 1 to FIG. 7, a method for processing data of a multifunctional automobile charger by using a microprocessor is implemented. The method includes the following steps:

Step 1: A single chip microcomputer 10 is first disposed on a main circuit board in a charger box 1, wherein a program memory 113 is disposed in the single chip microcomputer 10; a main program module 111, an ignition current detection program module 311, a TYPE-C charging current detection program module 411, an internal battery constant current charging detection program module 511, an internal battery temperature detection program module 611, a general U-port output current detection program module 711, a wireless charging failure detection program module 811, and a program module 911 for Bluetooth communication with a mobile phone are loaded in the single chip microcomputer; and instructions of the program modules are suitable for being loaded and executed by a processor 110.

Step 2: After the charger box 1 is controlled to start up, the main program module 111 calls a constant current charging adjustment circuit unit 51 to detect a voltage B+ of an internal battery; the internal battery constant current charging detection program module 511 performs A/D conversion on analog data of the voltage B+ of the internal battery to obtain digital data, stores the digital data into a program running variable register 112, and then compares the data with a voltage form in the internal battery constant current charging detection program module 511 to obtain present voltage data of the voltage B+ of the internal battery; and the main program module 111 determines, according to the voltage data, lamps to be turned on in indicator lamps 1 to 4.

Step 3: Next, data processing of subsequent operations is determined: a. if the internal battery is charged, proceeding to data processing in step 4; b. if power is taken from a TYPE-C port, proceeding to data processing in step 5; c. if power is taken from a general U port, proceeding to data processing in step 6; d. if wireless charging is performed, proceeding to data processing in step 7; e. if Bluetooth communication is conducted with a mobile phone, proceeding to data processing in step 8; and f. if the internal battery is used for ignition, proceeding to data processing in step 9.

Step 4: When the internal battery is charged, the internal battery constant current charging detection program module 511 detects an analog voltage value inputted via an $18^{th}$ pin E of the single chip microcomputer 10, calls an A/D conversion subprogram module to process the analog voltage value, stores the voltage value into the program running variable register 112, then looks up a table to convert the voltage value into a present charging current value, and compares the present charging current value with a target charging current value stored in the internal battery constant current charging detection program module 511; if the present charging current value is not consistent with the target charging current value, the internal battery constant current charging detection program module 511 adjusts a pulse width of a PWM signal outputted by a $2^{nd}$ pin of the single chip microcomputer 10, then re-detects the present charging current value and re-compares the present charging current value with the target charging current value; and if the present charging current value is consistent with the target charging current value, the internal battery is charged continuously, and then step 10 is performed.

Step 5: When power is taken from the TYPE-C port, the TYPE-C charging current detection program module 411 calls an extended port A/D subprogram module, selects analog voltage data on a TYPE-C-AD2 line in a TYPE-C circuit unit 41, and inputs the analog voltage data via a $21^{st}$ pin AD-OUT of the single chip microcomputer 10; after calling the A/D conversion subprogram module to process the analog voltage data, the TYPE-C charging current detection program module 411 stores the voltage value into the program running variable register 112, and then looks up a table to convert the voltage value into a present charging current value; at this point, if the TYPE-C charging current detection program module 411 judges that an output current at the TYPE-C port is greater than or equal to 0.2 A, the internal battery is charged continuously, and if the TYPE-C charging current detection program module 411 judges that the output current is less than 0.2 A, a delay subprogram module is called to turn off the output of the TYPE-C port 42 30 minutes later; and then step 10 is performed.

Step 6: When power is taken from the general U port, the main program module 111 inspects on-off data inputted via a $34^{th}$ pin of the single chip microcomputer 10 of a single action button unit 21; then the general U-port output current detection program module 711 is executed, calls the extended port A/D subprogram module, selects analog voltage data on an ADI line of a general U-port 5V output circuit unit 71, and inputs the analog voltage data via a $14^{th}$ pin of the single chip microcomputer 10; after calling the A/D conversion subprogram module to process the analog voltage data, the general U-port output current detection program module 711 stores the voltage value into the program running variable register 112, and then looks up a table to convert the voltage value into a present charging current value; at this point, if the general U-port output current detection program module 711 judges that an output current at a first general U port 72 or a second general U port 73 is greater than or equal to 0.2 A, the internal battery is charged continuously, and if the general U-port output current detection program module 711 judges that the output current is less than 0.2 A, the delay subprogram module is called to turn off the output of the general U port 30 minutes later; and then step 10 is performed.

Step 7: When wireless charging is performed, the wireless charging failure detection program module 811 calls a wireless charging subprogram module to detect on-off quantity data inputted via a $1^{st}$ pin AD2 of the single chip microcomputer 10; if the input is "0", the wireless charging failure detection program module 811 keeps a $40^{th}$ pin of the single chip microcomputer 10 as "1" all the time, and when the input of the $1^{st}$ pin of the single chip microcomputer 10 is "1", the wireless charging failure detection program module 811 drives the $40^{th}$ pin of the single chip microcomputer 10 to be "0", the power supply for a wireless charging failure detection circuit unit 81 is turned off, and then step 10 is performed.

Step 8: When Bluetooth communication is conducted with the mobile phone, the program module 911 for Bluetooth communication with a mobile phone starts to run to cause the single chip microcomputer 10 to conduct serial asynchronous communication with a Bluetooth chip IC13 in a Bluetooth circuit unit 91, and sends present remaining capacity data, battery voltage data, battery temperature data, working state data of button switches, alarm status data, and ignition frequency data to a mobile phone via the Bluetooth circuit unit 91, corresponding APP software in the mobile phone displays the data on a user interface of the mobile phone, and then step 10 is performed.

Step 9: When the internal battery is used for ignition, an ignite button 23 is pressed down first, and the ignition current detection program module 311 starts to run, an ignition current detection circuit unit 31 being connected to a $17^{th}$ pin V4 of the single chip microcomputer 10 to input analog voltage data that is obtained after a voltage drop of a current between battery cathode lines B1– and B2– on a line resistor is amplified; after calling the A/D conversion subprogram module to process the analog voltage data, the ignition current detection program module 311 stores the data into the program running variable register 112, and compares the data with a value that has been set in the ignition current detection program module 311; if the ignition circuit data is less than the set data, the ignition current detection program module 311 outputs "0" to a $23^{rd}$ pin REPLAY of the single chip microcomputer 10 to turn off the ignition current detection circuit unit 31, and then step 10 is performed.

Step 10: In the meanwhile, the internal battery temperature detection program module 611 constantly inputs analog voltage data via a $13^{rd}$ pin NTC of the single chip microcomputer 10, first calls the A/D conversion subprogram module to process the analog voltage data, stores the data into the program running variable register 112, then calls a battery temperature conversion subprogram module to process the data, and compares the data with a temperature comparison form set in the internal battery temperature detection program module 611 to determine a present battery temperature; when the battery temperature is higher than 60° C., the internal battery temperature detection program module 611 immediately alarms for 5 seconds, and turns off all output operations; if the battery temperature is normal, step 3 is performed; and if there are no other operations and no ongoing process, the main program module 111 turns off the power 5 minutes later.

In step 4, after the A/D conversion subprogram module is called to process the analog voltage value inputted via the $18^{th}$ pin E of the single chip microcomputer 10, the voltage value is stored into the program running variable register 112, then the table is looked up to convert the voltage value into a present charging current value, and the present charging current value is compared with the target charging current value stored in the internal battery constant current charging detection program module 511; in the comparison, when the present charging current value is greater than the target charging current value, the internal battery constant current charging detection program module 511 subtracts the target charging current value from the present charging current value to obtain a difference and reduces an output duty cycle of PWM according to the difference; otherwise, the internal battery constant current charging detection program module 511 increases the duty cycle.

In step 5, when power is taken from the TYPE-C port, the TYPE-C charging current detection program module 411 calls the extended port A/D subprogram module and selects the analog voltage data on the TYPE-C-AD2 line in the TYPE-C circuit unit 41, wherein the analog voltage data is selected in the following manner: the extended port A/D subprogram module sets an $11^{th}$ pin A01 of the single chip microcomputer 10 to "1", sets an $8^{th}$ pin B01 to "0", and sets a $7^{th}$ pin C01 to "0".

In step 6, after the work begins, the main program module 111 inspects the on-off data inputted via the $34^{th}$ pin of the single chip microcomputer 10 of the single action button unit 21 and then the general U-port output current detection program module 711 is executed, wherein step 6 is implemented in the following manner: the main program module (111) outputs on-off quantity data "1" to a $40^{th}$ pin USB1 of the single chip microcomputer 10 when detecting that on-off quantity data of the $34^{th}$ pin of the single chip microcomputer 10 is "0".

In step 7, the wireless charging failure detection program module 811 calls the wireless charging subprogram module to detect the on-off quantity data inputted via the $1^{st}$ pin AD2 of the single chip microcomputer 10; if the input is "0", the wireless charging failure detection program module 811 keeps the $40^{th}$ pin of the single chip microcomputer 10 as "1" all the time, keeps the power supply, and at the same time, calls an LED lamp flow display subprogram module to drive LED lamps disposed on the top surface of the charger box 1 to be turned on in a flowing manner.

When the program module 911 for Bluetooth communication with a mobile phone starts to run, the Bluetooth chip IC13 needs to be successfully paired with Bluetooth of the mobile phone in advance; the remaining capacity data, the battery voltage data, the battery temperature data, the working state data of the button switches, the alarm status data, and the ignition frequency data are all stored in the program running variable register 112 and wait for being called by the program module 911 for Bluetooth communication with a mobile phone, and updated data will be sent to the mobile phone in real time.

In step 9, after the ignition current detection program module 311 starts to run, a reverse battery connection subprogram module stored in the program memory 113 is further called to detect whether an ignition clamp falls off, whether the ignition clamp is connected reversely, whether an ignition voltage exceeds a limit, and whether a backlash circuit exceeds a limit and is in a fault state, and if any of the above working states exists, the ignition current detection program module 311 outputs on-off quantity data "0" via a $23^{rd}$ pin of the single chip microcomputer 10 to turn off the output of the ignition current detection circuit unit 31.

An apparatus for processing data of a multifunctional automobile charger by using a microprocessor is designed and manufactured according to the above method. The apparatus includes: a charger box 1, wherein a single chip microcomputer 10 is disposed on a main circuit board in the charger box 1; a program memory 113 is disposed in the single chip microcomputer 10; a main program module 111, an ignition current detection program module 311, a TYPE-C charging current detection program module 411, an internal battery constant current charging detection program module 511, an internal battery temperature detection program module 611, a general U-port output current detection program module 711, a wireless charging failure detection program module 811, and a program module 911 for Bluetooth communication with a mobile phone are loaded in the single chip microcomputer; and instructions of the program modules are suitable for being loaded and executed by a processor 110.

The main program module 111 inspects an ignite button, a 5V output button, a light button and an AC output button in a single operation button unit 21 of the single chip microcomputer 10, and starts corresponding program modules to run according to input on-off quantity data "0" and "1".

After the main program module 111 detects that a $34^{th}$ pin of the single chip microcomputer 10 inputs "0" level data, the ignition current detection program module 311 starts up, and the ignition current detection program module 311 outputs "1" level data via a $23^{rd}$ pin of the single chip microcomputer 10 and turns on the output of an ignition current detection circuit unit 31.

After starting to run, the TYPE-C charging current detection program module 411 outputs "1" level data at a $40^{th}$ pin of the single chip microcomputer 10 to switch on a TYPE-C charging current detection circuit unit 41 to output power, and the TYPE-C charging current detection program module 411 inputs detection data of a charging current via a $21^{st}$ pin of the single chip microcomputer 10 and determines the time for turning off the output.

After starting to run, the internal battery constant current charging detection program module 511 detects analog voltage data of an $18^{th}$ pin of the single chip microcomputer 10 to perform A/D conversion, obtains digital data, and converts the digital data into present charging current data, and stores the present charging current data into a program running variable register 112; when the present charging current value is greater than a target charging current value, the internal battery constant current charging detection program module 511 subtracts the target charging current value from the present charging current value to obtain a difference and reduces an output duty cycle of PWM according to the difference; otherwise, the internal battery constant current charging detection program module 511 increases the duty cycle to implement constant current charging.

The internal battery temperature detection program module 611 constantly inputs analog voltage data of temperatures via a $13^{rd}$ pin NTC of the single chip microcomputer 10; after calling an A/D conversion subprogram module to process the analog voltage data, the internal battery temperature detection program module 611 stores the data into the program running variable register 112, then calls a battery temperature conversion subprogram module to process the data, compares the data with a temperature comparison form set in the internal battery temperature detection program module 611 to determine a present battery temperature, and when the battery temperature is higher than 60° C., immediately alarms for 5 seconds, and turns off all output operations; if the battery temperature is normal, no processing is performed;

After being executed, the general U-port output current detection program module 711 calls an extended port A/D subprogram module, selects analog voltage data on an ADI line of a general U-port 5-V output circuit unit 71, and inputs the analog voltage data via a $14^{th}$ pin of the single chip microcomputer 10; after calling the A/D conversion subprogram module to process the analog voltage data, the general U-port output current detection program module 711 stores the voltage value into the program running variable register 112, and then looks up a table to convert the voltage value into a present charging current value; at this point, if the general U-port output current detection program module 711 judges that an output current at a first general U port 72 or a second general U port 73 is greater than or equal to 0.2 A, charging is continued, and if the general U-port output current detection program module 711 judges that the output current is less than 0.2 A, the general U-port output current detection program module 711 calls a delay subprogram module to turn off the output of the general U port 30 minutes later.

The wireless charging failure detection program module 811 calls a wireless charging subprogram module to detect on-off quantity data inputted via a $1^{st}$ pin AD2 of the single chip microcomputer 10, and if the input is "0", keeps a $40^{th}$ pin of the single chip microcomputer 10 as "1" all the time; when the input of the $1^{st}$ pin of the single chip microcomputer 10 is "1", the wireless charging failure detection program module 811 drives the $40^{th}$ pin of the single chip microcomputer 10 to be "0", and turns off the power supply for a wireless charging failure detection circuit unit 81.

When the program module for Bluetooth communication with a mobile phone 911 starts to run, the single chip microcomputer 10 conducts serial asynchronous communication with a Bluetooth chip IC13 in a Bluetooth circuit unit 91, and sends present remaining capacity data, battery voltage data, battery temperature data, working state data of button switches, alarm status data, and ignition frequency data to a mobile phone via the Bluetooth circuit unit 91, and corresponding APP software in the mobile phone displays the data on a user interface of the mobile phone.

Subprogram modules stored in the program memory 113 include the extended port A/D subprogram module, the A/D conversion subprogram module, the delay subprogram module, the battery temperature conversion subprogram module, the wireless charging subprogram module, an LED lamp flow display subprogram module, and a reverse battery connection subprogram module, and the subprogram modules can be called and executed by the program modules and the subprogram modules.

The charger box 1 is a flat circular box body, an LED indicator lamp set 22 is disposed on the top surface of the box body, and the LED indicator lamp set 22 includes indicator lamps 1 to 4; a charging socket 52, an ignite button 23, an ignition output jack 32, the first general U port 72, the second general U port 73, a general U-port output button 24 and a TYPE-C socket 42 are sequentially arranged on the front surface of the charger box 1, a Bluetooth circuit board 92 is disposed at a box arc edge of the charger box 1 on one side of the TYPE-C socket 42, and an antenna charging coil 82 is disposed on the top surface of the box body.

There is an AC output interface at the back of the charger box 1 in FIG. 1.

Figure 2:
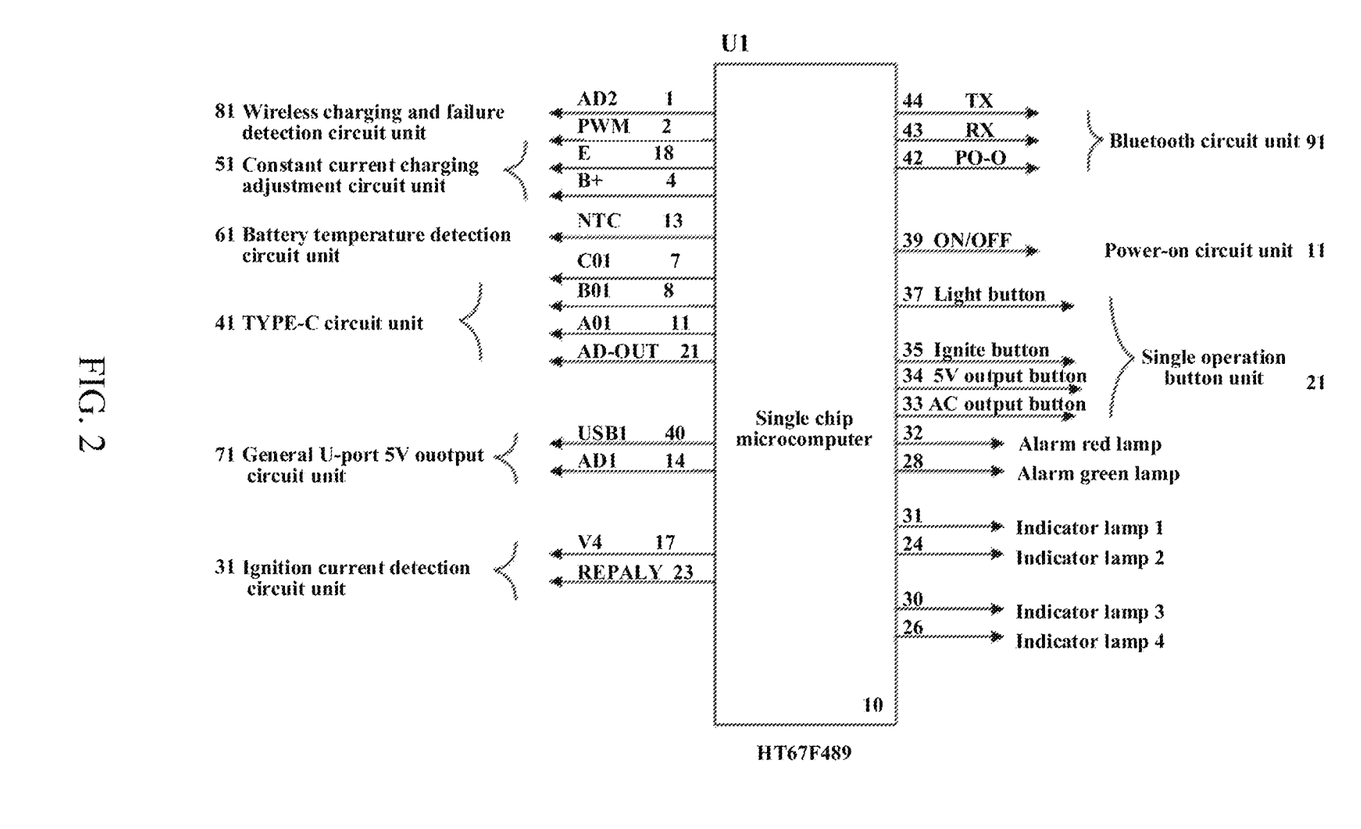
FIG. 2 is a block diagram of control over circuit units in a method and an apparatus for processing data of a multifunctional automobile charger by using a microprocessor according to the present invention.
Figure 3:
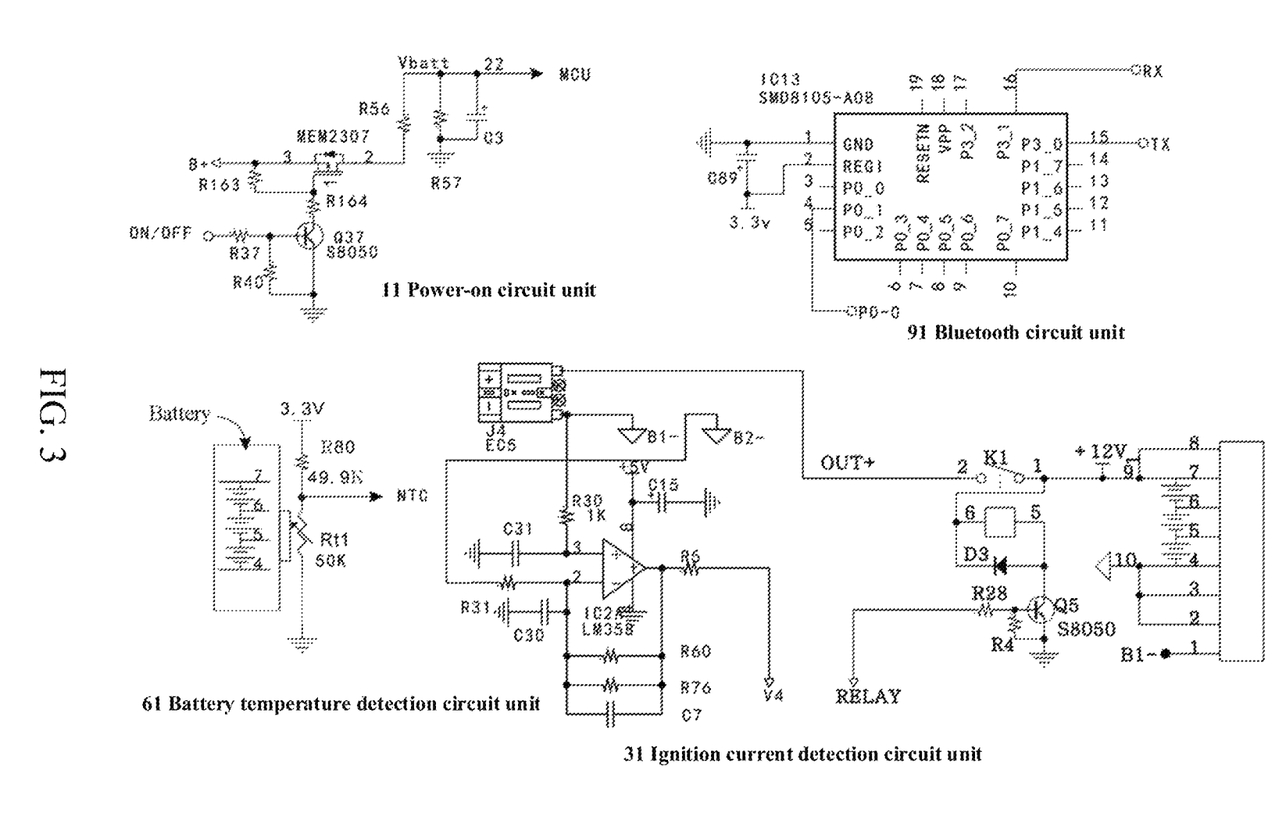
FIG. 3 is an electrical principle diagram of a power-on circuit unit 11, a battery temperature detection circuit unit 61, a Bluetooth circuit unit 91 and an ignition current detection circuit unit in a method and an apparatus for processing data of a multifunctional automobile charger by using a microprocessor according to the present invention.
Figure 4:
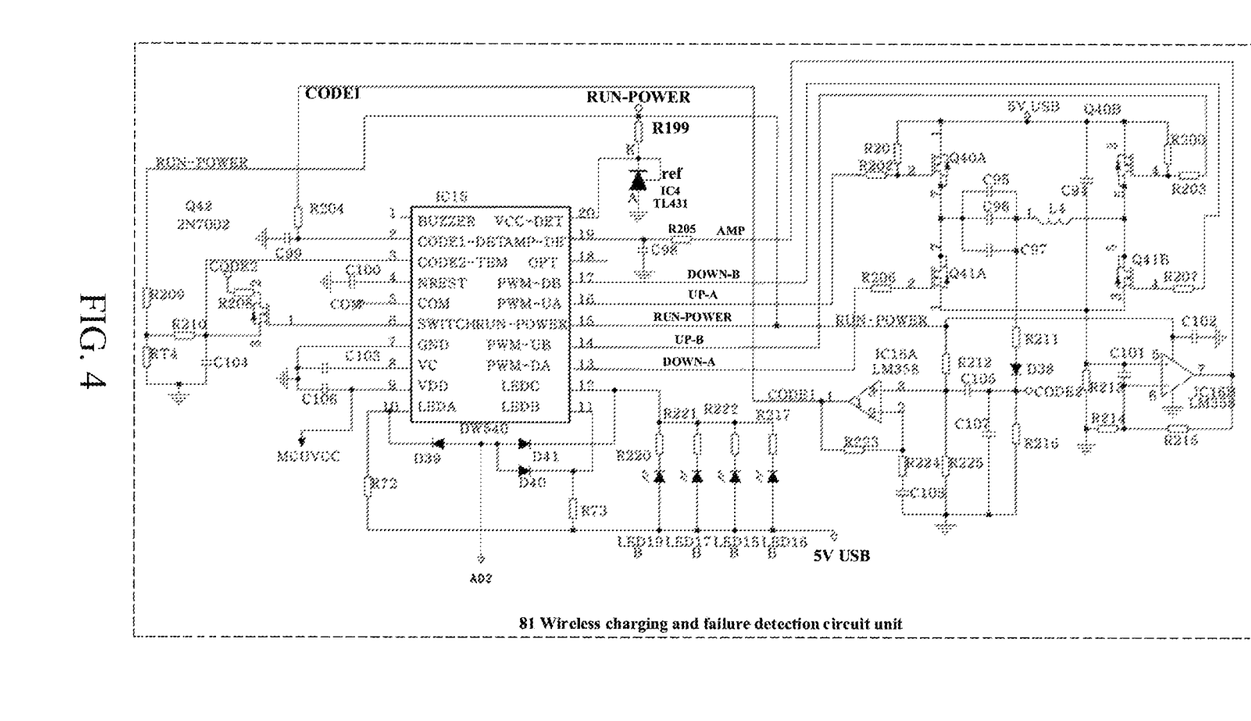
FIG. 4 is a detailed electrical principle schematic diagram of a wireless charging and failure detection circuit unit in a method and an apparatus for processing data of a multifunctional automobile charger by using a microprocessor according to the present invention.

An alarm red lamp and an alarm green lamp in FIG. 2 are driven by an alarm subprogram module loaded in the program memory 113, and flash when needed.

Figure 5:
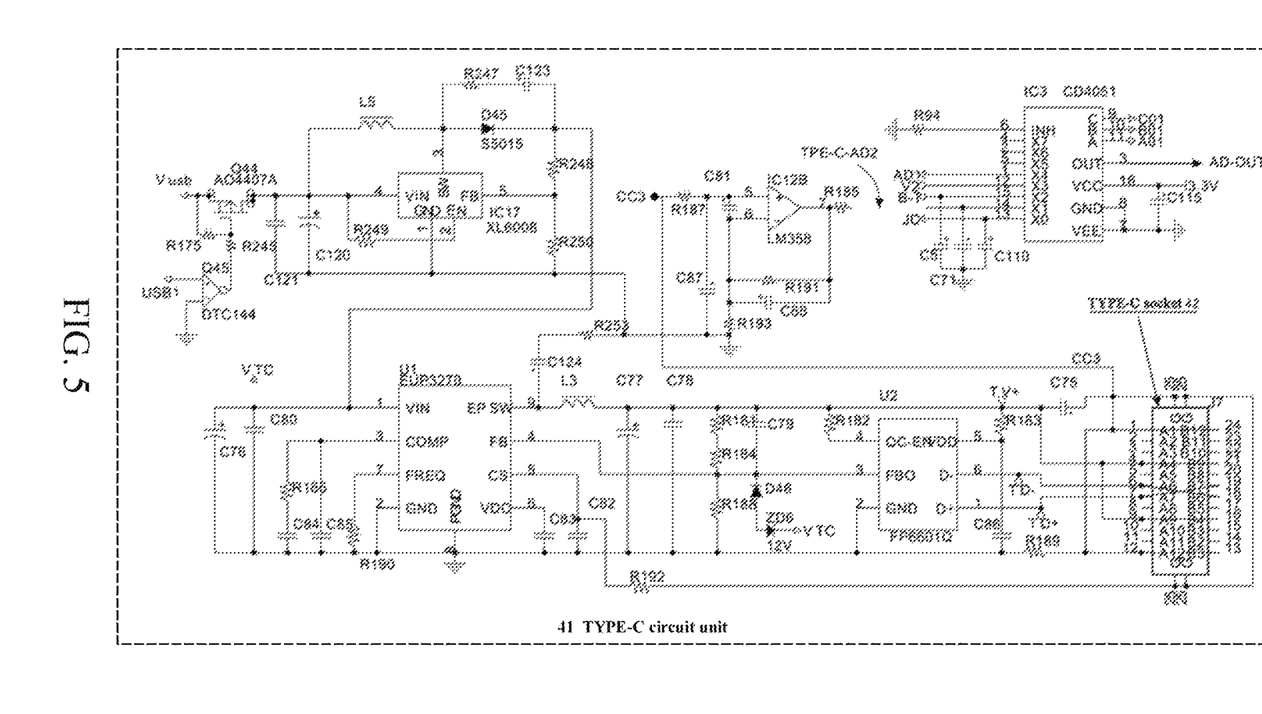
FIG. 5 is a detailed electrical principle schematic diagram of a TYPE-C circuit unit in a method and an apparatus for processing data of a multifunctional automobile charger by using a microprocessor according to the present invention.
Figure 6:
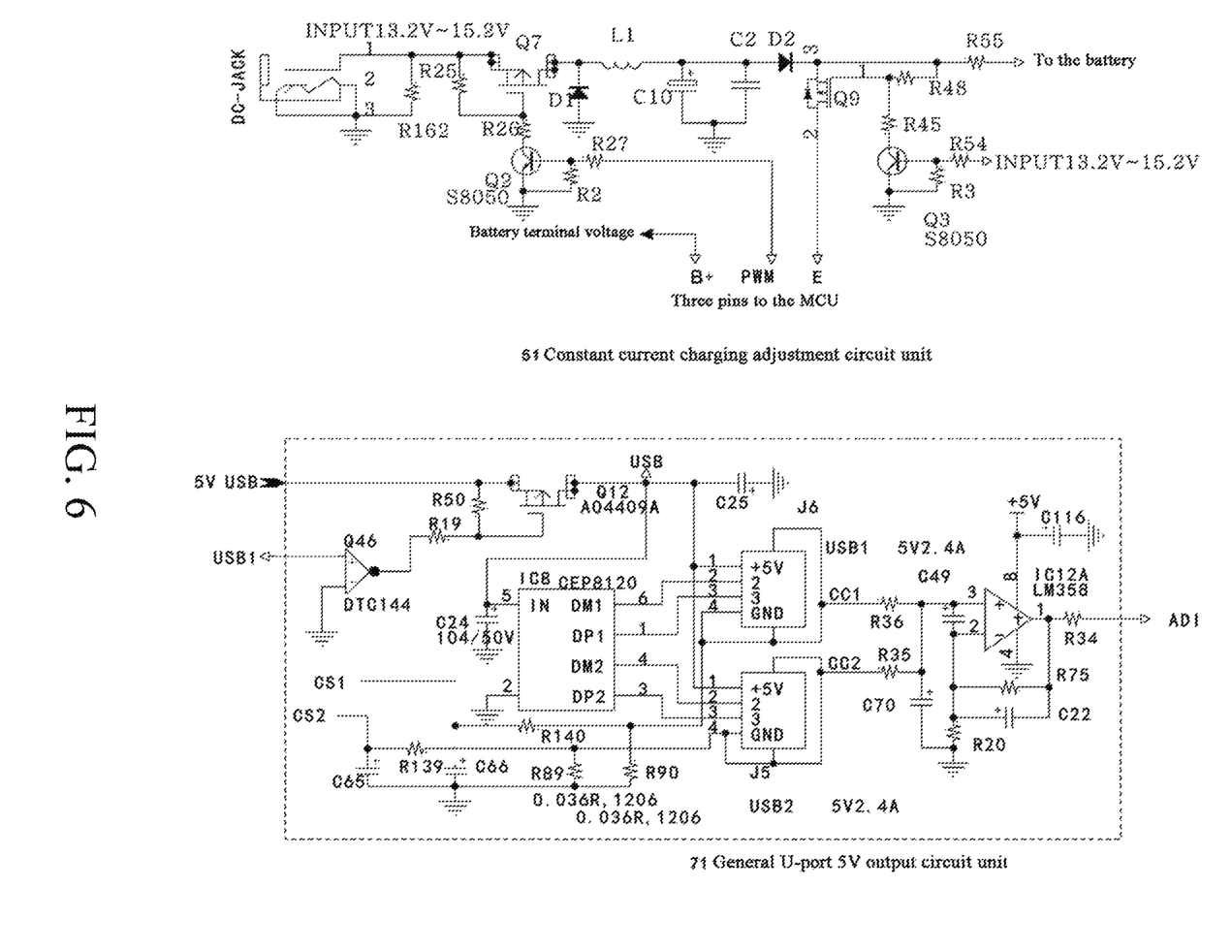
FIG. 6 is a detailed electrical principle schematic diagram of a constant current charging adjustment circuit unit 51 and a general U-port 5V output current unit 71 in a method and an apparatus for processing data of a multifunctional automobile charger by using a microprocessor according to the present invention.

In FIG. 5, a chip U2 automatically identifies the model of the apparatus to be inserted into the TYPE-C socket 42 and a required charging voltage; there are three types of charging voltages: DC12V, DC9V and DC5V, and the voltage is output from the TYPE-C socket 42.

In FIG. 2, the model of the single chip microcomputer 10 is HT67F489. When another model is selected, the program modules and the subprogram modules are slightly adjusted, and then instructions are stored in the program memory 113 for the processor 110 to load and execute.

The above contents are merely preferred embodiments of the present invention. Those of ordinary skill in the art can change specific implementation manners and the application scope according to the idea of the present invention. The contents of the specification should not be construed as a limitation to the present invention.

The invention claimed is:

1. A method for processing data of a multifunctional automobile charger by using a microprocessor, adapted to run on a single chip microcomputer, wherein the method comprises the following steps:
   step 1: first disposing a single chip microcomputer on a main circuit board in a charger box, wherein a program memory is disposed in the single chip microcomputer; a main program module, an ignition current detection program module, a TYPE-C charging current detection program module, an internal battery constant current charging detection program module, an internal battery temperature detection program module, a general U-port output current detection program module, a wireless charging failure detection program module, and a program module for Bluetooth communication with a mobile phone are loaded in the single chip microcomputer; and instructions of the program modules are suitable for being loaded and executed by the microprocessor;
   step 2: after the charger box is controlled to start up, the main program module calling a constant current charging adjustment circuit unit to detect a voltage B+ of an internal battery; the internal battery constant current charging detection program module performing A/D conversion on first analog data of the voltage B+ of the internal battery to obtain first digital data and storing the first digital data into a program running variable register; and the main program module determining, according to the first digital data of the voltage B+, which one of indicator lamps 1 to 4 to be turned on;

step 3: next, determining data processing of subsequent operations: a. if the internal battery is charged, proceeding to data processing in step 4; b. if power is taken from a TYPE-C port, proceeding to data processing in step 5; c. if power is taken from a general U port, proceeding to data processing in step 6; d. if wireless charging is performed, proceeding to data processing in step 7; e. if Bluetooth communication is conducted with a mobile phone, proceeding to data processing in step 8; and f. if the internal battery is used for ignition, proceeding to data processing in step 9;

step 4: when the internal battery is charged, the internal battery constant current charging detection program module detecting a second analog voltage data inputted via an $18^{th}$ pin E of the single chip microcomputer calling an A/D conversion subprogram module to process the second analog voltage data to obtain a second digital voltage value, storing the second digital voltage value into the program running variable register, then looking up a table to convert the second digital voltage value into a present charging current value, and comparing the present charging current value with a target charging current value stored in the internal battery constant current charging detection program module; if the present charging current value is not consistent with the target charging current value, adjusting a pulse width of a PWM signal outputted by a $2^{nd}$ pin of the single chip microcomputer; then re-detecting the present charging current value and re-comparing the present charging current value with the target charging current value; and if the present charging current value is consistent with the target charging current value, charging the internal battery continuously, and proceeding to step 10;

step 5: when power is taken from the TYPE-C port, the TYPE-C charging current detection program module calling an extended port A/D subprogram module, selecting third analog voltage data on a TYPE-C-AD2 line in a TYPE-C circuit unit, and inputting the third analog voltage data via a $21^{st}$ pin AD-OUT of the single chip microcomputer; after calling the A/D conversion subprogram module to process the third analog voltage data to obtain a third digital voltage value, the TYPE-C charging current detection program module storing the third digital voltage value into the program running variable register, and then looking up a table to convert the third digital voltage value into a present output current at the TYPE-C port; at this point, if the TYPE-C charging current detection program module judges that the present output current at the TYPE-C port is greater than or equal to 0.2 A, continuing charging the internal battery, and if the TYPE-C charging current detection program module judges that the present output current at the TYPE-C port is less than 0.2 A, calling a delay subprogram module to turn off the output of the TYPE-C port 30 minutes later; and then proceeding to step 10;

step 6: when power is taken from the general U port, the main program module inspecting on-off data inputted via a $34^{th}$ pin of the single chip microcomputer of a single action button unit; then the general U-port output current detection program module being executed, calling the extended port A/D subprogram module, selecting fourth analog voltage data on an ADI line of a general U-port 5V output circuit unit, and inputting the fourth analog voltage data via a $14^{th}$ pin of the single chip microcomputer; after calling the A/D conversion subprogram module to process the fourth analog voltage data to obtain a fourth digital voltage value, the general U-port output current detection program module storing the fourth digital voltage value into the program running variable register, and then looking up a table to convert the fourth digital voltage value into a present output current at a first general U port or a second general U port; at this point, if the general U-port output current detection program module judges that the present output current at a first general U port or a second general U port is greater than or equal to 0.2 A, continuing charging the internal battery, and if the general U-port output current detection program module judges that the present output current at a first general U port or a second general U port is less than 0.2 A, calling the delay subprogram module to turn off the output of the general U port 30 minutes later; and then proceeding to step 10;

step 7: when wireless charging is performed, the wireless charging failure detection program module calling a wireless charging subprogram module to detect on-off quantity data inputted via a $1^{st}$ pin AD2 of the single chip microcomputer; if the input is "0", keeping a $40^{th}$ pin of the single chip microcomputer as "1" all the time, and when the input of the $1^{st}$ pin of the single chip microcomputer is "1", the wireless charging failure detection program module driving the $40^{th}$ pin of the single chip microcomputer to be "0", turning off the power supply for a wireless charging failure detection circuit unit, and proceeding to step 10;

step 8: when Bluetooth communication is conducted with the mobile phone, the program module for Bluetooth communication with a mobile phone starting to run to cause the single chip microcomputer to conduct serial asynchronous communication with a Bluetooth chip IC13 in a Bluetooth circuit unit, and sending present remaining capacity data, battery voltage data, battery temperature data, working state data of button switches, alarm status data, and ignition frequency data to the mobile phone via the Bluetooth circuit unit, corresponding APP software in the mobile phone displaying the data on a user interface of the mobile phone, and proceeding to step 10;

step 9: when the internal battery is used for ignition, first pressing down an ignite button, and the ignition current detection program module starting to run, an ignition current detection circuit unit being connected to a $17^{th}$ pin V4 of the single chip microcomputer to input fifth analog voltage data that is obtained after a voltage drop of a current between battery cathode lines B1− and B2− on a line resistor is amplified; after calling the A/D conversion subprogram module to process the fifth analog voltage data to obtain a fifth digital voltage value, the ignition current detection program module storing the fifth digital voltage data into the program running variable register, and comparing the fifth digital voltage data with a value that has been set in the ignition current detection program module; if the ignition circuit data is less than the value set in the ignition current detection program module, the ignition current detection program module outputting "0" to a $23^{rd}$ pin REPLAY of the single chip microcomputer to turn off the ignition current detection circuit unit, and proceeding to step 10; and step 10: in the meanwhile, the internal battery temperature detection program module constantly inputting sixth analog voltage data via a $13^{th}$ pin NTC of the single chip microcomputer first calling the A/D conversion subprogram module to process the sixth analog voltage data to obtain a sixth digital voltage value, storing the sixth digital voltage value into the program running variable register, then calling a battery temperature conversion subprogram module to look up a temperature comparison table set in the internal battery temperature detection program module to determine a present battery temperature; when the present battery temperature is higher than 60° C., immediately alarming for 5 seconds, and turning off all output operations; if the present battery temperature is normal, proceeding to step 3; and if there are no other operations and no ongoing process, the main program module turning off the power 5 minutes later.

2. The method for processing data of a multifunctional automobile charger by using a microprocessor according to claim 1, wherein in step 4, after the A/D conversion subprogram module is called to process the analog voltage value inputted via the $18^{th}$ pin E of the single chip microcomputer, the second digital voltage value is stored into the program running variable register, then the table is looked up to convert the second digital voltage value into the present charging current value, and the current charging current value is compared with the target charging current value stored in the internal battery constant current charging detection program module; in the comparison, when the present charging current value is greater than the target charging current value, the internal battery constant current charging detection program module subtracts the target charging current value from the present charging current value to obtain a difference and reduces an output duty cycle of PWM according to the difference; otherwise, the internal battery constant current charging detection program module increases the duty cycle.

3. The method for processing data of a multifunctional automobile charger by using a microprocessor according to claim 1, wherein in step 5, when power is taken from the TYPE-C port, the TYPE-C charging current detection program module calls the extended port A/D subprogram module and selects the analog voltage data on the TYPE-C-AD2 line in the TYPE-C circuit unit, wherein the analog voltage data is selected in the following manner: the extended port A/D subprogram module sets an $11^{th}$ pin A01 of the single chip microcomputer to "1", sets an $8^{th}$ pin B01 to "0", and setting a $7^{th}$ pin C01 to "0".

4. The method for processing data of a multifunctional automobile charger by using a microprocessor according to claim 1, wherein in step 6, after the work begins, the main program module inspects the on-off data inputted via the $34^{th}$ pin of the single chip microcomputer of the single action button unit and then the general U-port output current detection program module is executed, wherein step 6 is implemented in the following manner: the main program module outputs on-off quantity data "1" to a $40^{th}$ pin USB1 of the single chip microcomputer when detecting that on-off quantity data of the $34^{th}$ pin of the single chip microcomputer is "0".

5. The method for processing data of a multifunctional automobile charger by using a microprocessor according to claim 1, wherein in step 7, the wireless charging failure detection program module calls the wireless charging subprogram module to detect the on-off quantity data inputted via the $1^{st}$ pin AD2 of the single chip microcomputer; if the input is "0", the wireless charging failure detection program module keeps the $40^{th}$ pin of the single chip microcomputer as "1" all the time, keeps the power supply, and at the same time, calls an LED lamp flow display subprogram module to drive LED lamps disposed on the top surface of the charger box to be turned on in a flowing manner.

6. The method for processing data of a multifunctional automobile charger by using a microprocessor according to claim 1, wherein when the program module for Bluetooth communication with a mobile phone starts to run, the Bluetooth chip IC13 needs to be successfully paired with Bluetooth of the mobile phone in advance; the remaining capacity data, the battery voltage data, the battery temperature data, the working state data of the button switches, the alarm status data, and the ignition frequency data are all stored in the program running variable register and wait for being called by the program module for Bluetooth communication with a mobile phone, and updated data will be sent to the mobile phone in real time.

7. The method for processing data of a multifunctional automobile charger by using a microprocessor according to claim 1, wherein in step 9, after the ignition current detection program module starts to run, a reverse battery connection subprogram module stored in the program memory is further called to detect whether an ignition clamp falls off, whether the ignition clamp is connected reversely, whether an ignition voltage exceeds a limit, and whether a backlash circuit exceeds a limit and is in a fault state, and if any of the above working states exists, the ignition current detection program module outputs on-off quantity data "0" via the $23^{rd}$ pin of the single chip microcomputer to turn off the output of the ignition current detection circuit unit.

8. An apparatus for processing data of a multifunctional automobile charger by using a microprocessor, comprising: a charger box, wherein a single chip microcomputer is disposed on a main circuit board in the charger box; a program memory is disposed in the single chip microcomputer; a main program module, an ignition current detection program module, a TYPE-C charging current detection program module, an internal battery constant current charging detection program module, an internal battery temperature detection program module, a general U-port output current detection program module, a wireless charging failure detection program module, and a program module for Bluetooth communication with a mobile phone are loaded in the single chip microcomputer; and instructions of the program modules are suitable for being loaded and executed by the microprocessor;

wherein the main program module inspects an ignite button, a 5V output button, a light button or an AC output button in a single operation button unit of the single chip microcomputer and starts corresponding program modules to run according to input on-off quantity data "0" and "1";

after the main program module detects that a $34^{th}$ pin of the single chip microcomputer inputs "0" level data, the ignition current detection program module starts up, and the ignition current detection program module outputs "1" level data via a $23^{rd}$ pin of the single chip microcomputer and turns on the output of an ignition current detection circuit unit;

after starting to run, the TYPE-C charging current detection program module outputs "1" level data at a $40^{th}$ pin of the single chip microcomputer- to switch on a TYPE-C charging current detection circuit unit to output power, and the TYPE-C charging current detection program module inputs detection data of a charging current via a $21^{st}$ pin of the single chip microcomputer and determines the time for turning off the output;

after starting to run, the internal battery constant current charging detection program module detects second analog voltage value of an $18^{th}$ pin E of the single chip microcomputer to perform A/D conversion to obtain a second digital voltage value, converts the second digital voltage value into present charging current value, and stores the present charging current value into a program running variable register; when the present charging current value is greater than a target charging current value, the internal battery constant current charging detection program module subtracts the target charging current value from the present charging current value to obtain a difference and reduces an output duty cycle of PWM according to the difference; otherwise, the internal battery constant current charging detection program module increases the duty cycle to implement constant current charging;

the internal battery temperature detection program module constantly inputs sixth analog voltage data of temperature via a $13^{th}$ pin NTC of the single chip microcomputer; after calling an A/D conversion subprogram module to process the sixth analog voltage data to obtain a sixth digital voltage value, the internal battery temperature detection program module stores the sixth digital voltage value into the program running variable register, then calls a battery temperature conversion subprogram module to look up a temperature comparison table set in the internal battery temperature detection program module to determine a present battery temperature, and when the battery temperature is higher than 60° C., immediately alarms for 5 seconds, and turns off all output operations; if the present battery temperature is normal, no processing is performed;

after being executed, the general U-port output current detection program module calls an extended port A/D subprogram module, selects fourth analog voltage data on an ADI line of a general U-port 5V output circuit unit, and inputs the fourth analog voltage data via a $14^{th}$ pin of the single chip microcomputer; after calling the A/D conversion subprogram module to process the fourth analog voltage data to obtain a fourth digital voltage value, the general U-port output current detection program module stores the fourth digital voltage value into the program running variable register, and then looks up a table to convert the fourth digital voltage value into a present output current at a first general U port or a second general U port; at this point, if the general U-port output current detection program module judges that the present output current at a first general U port or a second general U port is greater than or equal to 0.2 A, charging is continued, and if the general U-port output current detection program module judges that the present output current at a first general U port or a second general U port is less than 0.2 A, the general U-port output current detection program module calls a delay subprogram module to turn off the output of the general U port 30 minutes later;

the wireless charging failure detection program module calls a wireless charging subprogram module to detect on-off quantity data inputted via a $1^{st}$ pin AD2 of the single chip microcomputer and if the input is "0", keeps a $40^{th}$ pin of the single chip microcomputer as "1" all the time; when the input of the $1^{st}$ pin of the single chip microcomputer is "1", the wireless charging failure detection program module drives the $40^{th}$ pin of the single chip microcomputer to be "0", and turns off the power supply for a wireless charging failure detection circuit unit; and when the program module for Bluetooth communication with a mobile phone starts to run, the single chip microcomputer conducts serial asynchronous communication with a Bluetooth chip IC13 in a Bluetooth circuit unit, and sends present remaining capacity data, battery voltage data, battery temperature data, working state data of button switches, alarm status data, and ignition frequency data to a mobile phone via the Bluetooth circuit unit, and corresponding APP software in the mobile phone displays the data on a user interface of the mobile phone.

9. The apparatus for processing data of a multifunctional automobile charger by using a microprocessor according to claim 8, wherein subprogram modules stored in the program memory comprise the extended port A/D subprogram module, the A/D conversion subprogram module, the delay subprogram module, the battery temperature conversion subprogram module, the wireless charging subprogram module, an LED lamp flow display subprogram module, and a reverse battery connection subprogram module, and the subprogram modules can be called and executed by the program modules and the subprogram modules.

10. The apparatus for processing data of a multifunctional automobile charger by using a microprocessor according to claim 8, wherein the charger box is a flat circular box body, an LED indicator lamp set is disposed on the top surface of the box body, and the LED indicator lamp set comprises indicator lamps 1 to 4; a charging socket, an ignite button, an ignition output jack, the first general U port, the second general U port, a general U-port output button and a TYPE-C socket are sequentially arranged on the front surface of the charger box; a Bluetooth circuit board is disposed at a box arc edge of the charger box on one side of the TYPE-C socket, and an antenna charging coil is disposed on the top surface of the box body.

\* \* \* \* \*